US008946565B2

(12) United States Patent
Hattori et al.

(10) Patent No.: US 8,946,565 B2
(45) Date of Patent: Feb. 3, 2015

(54) ELECTRICAL JUNCTION BOX

(71) Applicant: Sumitomo Wiring Systems, Ltd., Yokkaichi-City, Mie (JP)

(72) Inventors: Yuuichi Hattori, Yokkaichi (JP); Akihiro Oda, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 48 days.

(21) Appl. No.: 13/889,713

(22) Filed: May 8, 2013

(65) Prior Publication Data

US 2013/0341084 A1 Dec. 26, 2013

(30) Foreign Application Priority Data

Jun. 20, 2012 (JP) ................................. 2012-138892

(51) Int. Cl.
*H05K 5/00* (2006.01)
*H05K 7/02* (2006.01)
*B60R 16/023* (2006.01)

(52) U.S. Cl.
CPC .............. *H05K 5/0004* (2013.01); *H05K 7/026* (2013.01); *B60R 16/0238* (2013.01)
USPC .............................. 174/520; 174/59; 439/76.2

(58) Field of Classification Search
CPC ........................... H05K 5/0069; H05K 5/0047
USPC ..................................... 174/520, 59; 439/76.2
See application file for complete search history.

(56) References Cited

U.S. PATENT DOCUMENTS

| | | | | |
|---|---|---|---|---|
| 6,570,088 | B1 * | 5/2003 | Depp et al. ....................... | 174/50 |
| 7,642,452 | B2 * | 1/2010 | Kanazawa et al. ............... | 174/50 |
| 7,733,632 | B2 * | 6/2010 | Ito ................... | 361/626 |
| 2008/0149387 | A1 * | 6/2008 | Oda ............................. | 174/520 |
| 2009/0321129 | A1 * | 12/2009 | Darr et al. ...................... | 174/520 |
| 2010/0025102 | A1 * | 2/2010 | Nishikawa .................... | 174/535 |
| 2011/0094792 | A1 * | 4/2011 | Asao ............................. | 174/520 |
| 2011/0100705 | A1 * | 5/2011 | Matsui ......................... | 174/535 |
| 2012/0006594 | A1 * | 1/2012 | Takeuchi et al. ............... | 174/520 |
| 2013/0000971 | A1 * | 1/2013 | Sakaki et al. ................. | 174/520 |
| 2013/0343018 | A1 * | 12/2013 | Hattori et al. ................. | 361/755 |
| 2013/0343030 | A1 * | 12/2013 | Hattori et al. ................. | 361/824 |
| 2013/0343031 | A1 * | 12/2013 | Hattori et al. ................. | 361/824 |

FOREIGN PATENT DOCUMENTS

JP 11-252746 9/1999

* cited by examiner

*Primary Examiner* — Hung V Ngo
(74) *Attorney, Agent, or Firm* — Gerald E. Hespos; Michael J. Porco; Matthew T. Hespos

(57) ABSTRACT

An electrical junction box is provided which has a novel structure that enables connectors to be stably connected even when an L-shaped connecting terminal is used as a connecting terminal of a lateral connection type connector. An upward extending portion (92) extending upright from an internal circuit (87) of a connecting terminal (90) is sandwiched by a housing (114) of a lateral connection type connector (128) and a terminal support (42), a first lateral support rib (64a) is provided on the terminal support (42), a second lateral support rib (64b) is provided on the housing (114), and a connecting portion (93) of the connecting terminal (90) is sandwiched by the pair of lateral support ribs (64a) and (64b) from both sides in the width direction.

12 Claims, 9 Drawing Sheets

ELECTRICAL JUNCTION BOX

BACKGROUND

1. Field of the Invention

The invention relates to an electrical junction box that is installed in an automobile or the like, and particularly relates to an electrical junction box equipped with a lateral connection type connector that opens to a lateral side of a box body.

2. Description of the Related Art

Electrical junction boxes, such as junction boxes that are installed in automobiles, are equipped with a large number of connectors. JP 11-252746A discloses a junction box with a lateral connection type connector that opens to a lateral side of the box body to make more effective use of the space in a box body. The lateral connection type connector has a connecting terminal provided on a bus bar or a printed circuit board. The bus bar or the printed circuit board constitutes an internal circuit of the electrical junction box and is accommodated in a connector housing that opens to the lateral side of the box body.

An L-shaped connecting terminal is used in the lateral connection type connector of the junction box of the type disclosed in JP 11-252746A to adjust the position of the connecting terminal within the connector housing in a height direction or to adjust the height position of the lateral connection type connector itself on the side face of the box body. The L-shaped connecting terminal has an upward extending portion extending up from the internal circuit, and a leading end edge portion of the upward extending portion is bent toward the outside of the box body and constitutes a connecting portion to which a counterpart connector is connectable.

There is a concern that the connecting portion of the L-shaped connecting terminal will move back in response to a pushing force that is exerted when a connector is connected thereto, and hence there is a concern that the connector cannot be connected stably. There also has been the risk that stability will be impaired if the connecting portion is not positioned accurately within the connector housing.

The invention was made in view of the above-described circumstances, and it is an object thereof to provide an electrical junction box having a novel structure that enables connectors to be connected stably even if an L-shaped connecting terminal is used as a connecting terminal of a lateral connection type connector.

SUMMARY OF THE INVENTION

The invention relates to an electrical junction box with a lateral connection type connector that opens into a side face of a box body. An L-shaped connecting terminal is provided in the lateral connection type connector and is connected to an internal circuit in the box body. The L shape connecting terminal includes an upward extending portion extending upright from the internal circuit and a connecting portion extending perpendicularly from a leading end of the upward extending portion. The connecting portion is accommodated in a housing. A terminal support is disposed on a side of the upward extending portion that is opposite to the housing. A first lateral support rib protrudes from a face of the terminal support that faces the housing and a second lateral support rib protrudes from a face of the housing that faces the terminal support. The connecting terminal is sandwiched by the first lateral support rib and the second lateral support rib from both sides in a width direction thereof.

The upward extending portion is sandwiched by the connector and the terminal support from both sides in the direction in which the connecting portion extends. A force is exerted on the connecting terminal in a pushing direction during connection of a connector. However, the terminal support supports the upward extending portion and prevents a backward movement of the connecting terminal. On the other hand, a force may be exerted on the connecting terminal in a pulling direction during removal of the connector from the connecting terminal, the upward extending portion can be supported by the housing. Thus, even if the L-shaped connecting including the upward extending portion extending upright from the terminal internal circuit is used, displacement of the connecting portion during insertion/removal of the connector can be prevented, so that the insertion/removal can be performed stably, and the connection reliability can be improved, and furthermore, in the case of, for example, a connecting terminal that is soldered to a printed circuit board, the occurrence of cracks in the solder can also be suppressed because the connecting terminal is stably supported during insertion/removal of the connector.

The first lateral support rib is provided on the terminal support, the second lateral support rib is provided on the housing, and the connecting portion of the connecting terminal is sandwiched by the lateral support ribs from both sides in the width direction. Thus, displacement of the connecting portion in the width direction is prevented, so that accurate positioning within the housing is possible. As a result, the connector can be connected more stably. In particular, since the lateral support ribs are provided separately on the terminal support and the housing, the direction in which the connecting terminal is mounted to the terminal supporting member and the housing can be set more flexibly when compared with a case where the lateral support ribs are fixed previously. Thus the design flexibility can be improved.

The internal circuit may be a printed circuit board, a bus bar or the like. Accordingly, the connecting terminal that is connected to the internal circuit may be a metal terminal or the like that is fixed to the printed circuit board by soldering or pressure-fitting, or may be a terminal that is formed, for example, by partially raising the bus bar into an L shape. Moreover, a specially provided member may be used as the terminal support, or various components that are provided in the electrical junction box may double as the terminal support. For example, if the connecting terminal is formed on the bus bar, a member on which the bus bar is placed may double as the terminal support, or, for example, a support that supports the upward extending portion of the connecting terminal may be formed in the upper case or the like that constitutes the box body, and the upper case may double as the terminal support.

The internal circuit may be a bus bar, and the upward extending portion and the connecting portion of the connecting terminal may be formed unitarily with the bus bar. An insertion slit preferably is formed in the terminal support, and the bus bar may be inserted into the insertion slit in the width direction of the connecting portion. The upward extending portion is disposed on the face of the terminal support that faces the housing through the insertion slit. The first lateral support rib preferably is provided forward of the bus bar in a direction in which the bus bar is inserted into the insertion slit, and the second lateral support rib is provided rearward of the bus bar in the insertion direction. Accordingly, the lateral support ribs can be disposed on both sides of the bus bar in the insertion direction, so that the connecting terminal can be sandwiched by the lateral support ribs from both sides in the width direction. Thus, the setting flexibility of the direction in which the bus bar is mounted to the terminal support is improved.

An upper support rib preferably protrudes from the face of the terminal support that faces the housing. A terminal insertion opening is formed in the housing and opens continuously from the face that faces the terminal support to an upper face of the housing. The connecting portion of the connecting terminal is inserted into the housing from an upper opening of the terminal insertion opening and is accommodated in the housing. Thus, the connecting portion is sandwiched vertically by an opening edge at a lower end of the terminal insertion opening and the upper support rib. Accordingly, the connecting portion of the connecting terminal is sandwiched in the width direction by the lateral support ribs and in the vertical direction by the opening edge at the lower end of the terminal insertion opening and the upper support rib to achieve accurate positioning and stable support of the connecting portion.

The terminal support preferably is provided on the side of the connecting terminal of the lateral connection type connector that is opposite to the housing. The first lateral support rib is provided on the terminal support, the second lateral support rib is provided on the housing so that the connecting terminal is sandwiched by the lateral support ribs from both sides in the width direction. Thus, the first and second lateral support ribs support the connecting terminal from both sides in the insertion/removal direction of the connector to suppress displacement of the connecting terminal in the width direction. As a result, insertion/removal of the connector can be performed more stably. Moreover, since the first and second lateral support ribs are provided separately on the terminal support and the housing, respectively, the direction in which the connecting terminal is mounted to the terminal support and the housing can be set more flexibly.

DETAILED DESCRIPTION OF THE PREFERRED EMBODIMENTS

Figure 1:
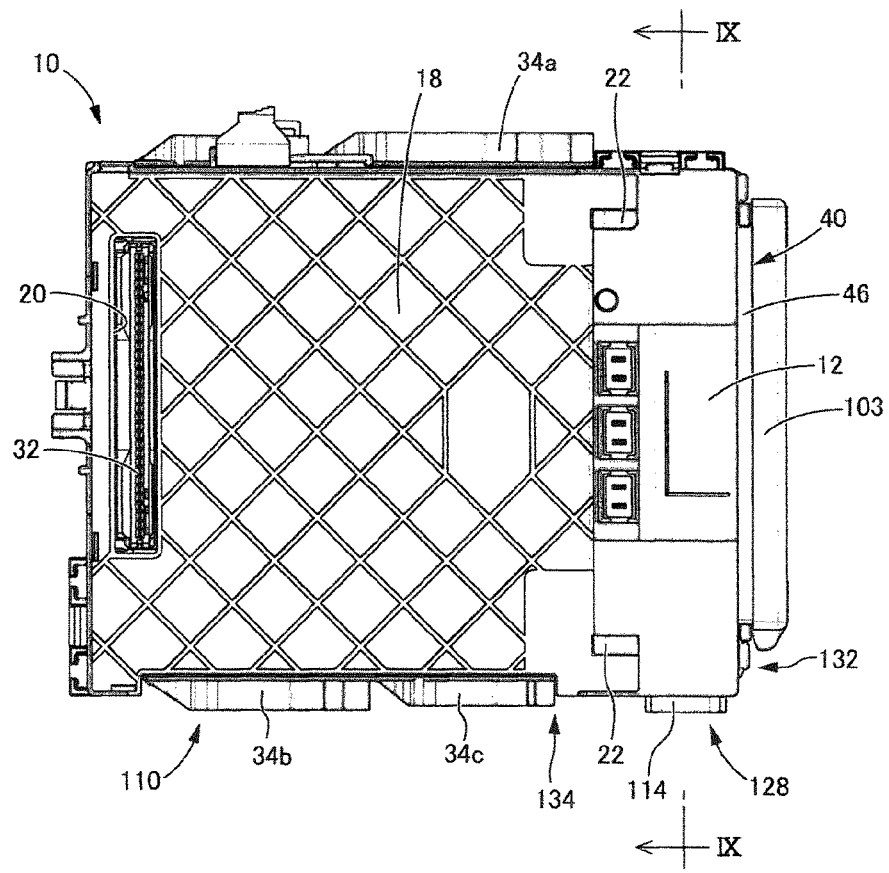
FIG. 1 is a plan view of an electrical junction box serving as an embodiment of the invention.

FIGS. 1 to 4 show an electrical junction box 10 in accordance with the invention. As is clear from FIG. 4, the electrical junction box 10 has a printed circuit board 16 that constitutes an internal circuit accommodated between an upper case 12 and a lower case 14. In the following description, "upper side" refers to the upper side in FIG. 2, and "lower side" refers to the lower side in FIG. 2.

The upper case 12 is molded unitarily of synthetic resin and has a substantially rectangular box-like shape that opens down. An attachment surface 18 is formed at an upper face of the upper case 12, and a connector insertion hole 20 penetrates the attachment surface 18 at one end of the upper case 12. Bearings 22 are provided outside the attachment surface 18 on the side opposite the connector insertion hole 20.

The lower case 14 is molded unitarily of synthetic resin and has a substantially rectangular box-like shape that opens up. The lower case 14 includes a bottom wall 24 with a substantially rectangular plate-like shape and a peripheral wall 26 extending up from an outer periphery of the bottom wall 24.

The printed circuit board 16 has a rectangular plate-like shape and electrical components, such as relays 28, are provided appropriately on a central portion of the printed circuit board 16. An elongate connector 32 for external connection extends up at an outer peripheral portion 30a at one side of the printed circuit board 16 and has a long direction parallel to the outer peripheral portion 30a. A lateral connection type connector 34a is disposed at an outer peripheral portion 30b along a side that is perpendicular to the outer peripheral portion 30a. The lateral connection type connector 34a has a connector accommodating member 36 formed of synthetic resin and open to a lateral side of the electrical junction box 10. L-shaped board terminals 38 are inserted into the connector accommodating member 36. One end of each board terminal 38 protrudes out from the connector accommodating member 36 to the side of the printed circuit board 16, while the other end extends toward the printed circuit board 16 and is soldered into connection with the printed circuit board 16.

Figure 5:
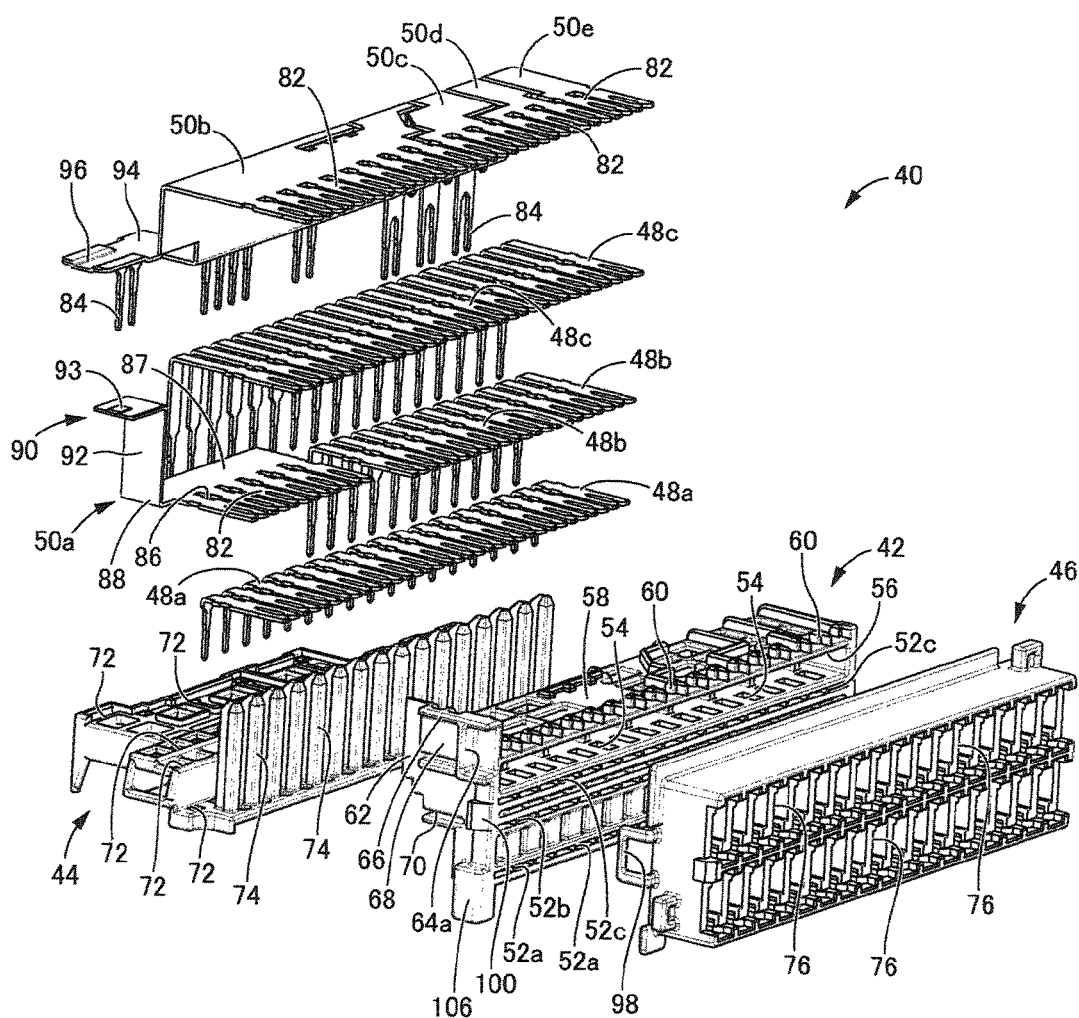
FIG. 5 is an exploded perspective view of a fuse module.
Figure 6:
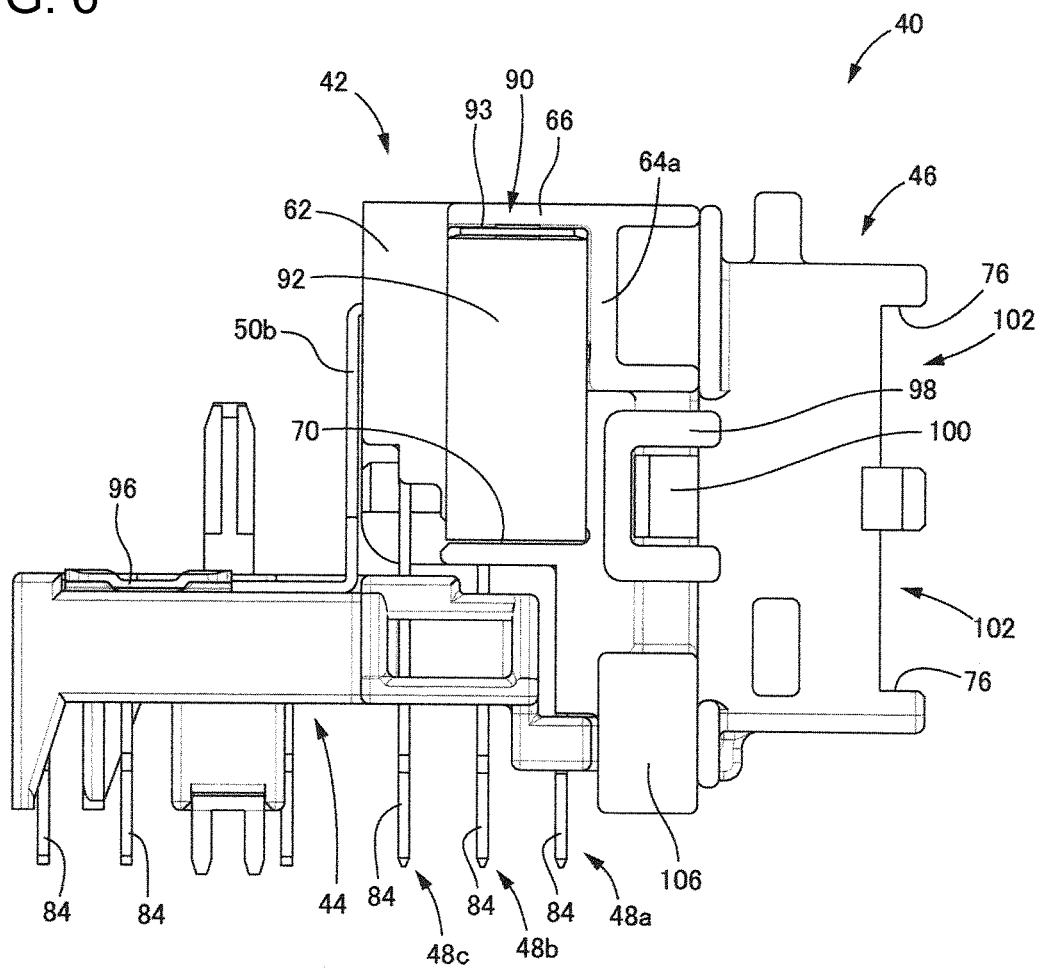
FIG. 6 is a side view of the fuse module.

A fuse module 40 is provided at an outer peripheral portion 30c on a side of the printed circuit board 16 opposite the connector 32 for external connection. As shown in FIGS. 5 and 6, the fuse module 40 includes a terminal holding block 42, a base 44, a fuse case 46, board terminals 48a to 48c, and busbars 50a to 50e.

The terminal support 42 is molded unitarily of synthetic resin and has a substantially elongated block-like shape. Terminal insertion holes 52a to 52c penetrate the terminal support 42 in a front-rear direction (left-right direction in FIG. 6) and are arranged side by side in a longitudinal direction of the terminal support 42. The terminal insertion holes 52a to 52c are arranged in three vertically spaced tiers. The terminal insertion holes 52a in the lowermost tier are arranged side by side and are vertically opposed respectively to the terminal insertion holes 52b in the middle tier with a space between the opposed terminal insertion holes 52a, 52b corresponding to a distance between a pair of connecting terminals of a fuse, which is not shown. The terminal insertion holes 52c are arranged side by side above the terminal insertion holes 52b. Pin insertion holes 54 extend vertically through the terminal support 42 at positions between horizontally adjacent terminal insertion holes 52a, 52b, 52c in each tier. An empty space 56 is formed above the terminal insertion holes 52c and opens forward (right in FIG. 6). The empty space 56 has an elongated rectangular shape extending in the longitudinal direction of the terminal support 42, and upper ends of the pin insertion holes 54 open into the empty space 56. The pin insertion holes 54 are formed at predetermined intervals in the longitudinal direction of the terminal support 42. Support projections 60 are formed on a front (right in FIG. 6) end edge of an upper face 58 of the terminal support 42 and are arranged at predetermined intervals in the longitudinal direction of the terminal support 42.

A first lateral support rib 64a protrudes from one side face 62 of the terminal support 42 and extends vertically at a position slightly toward the front of the terminal support 42. An upper support rib 66 extends horizontally along the upper edge of the side face 62 at the upper end of the first lateral support rib 64a. The upper support rib 66 and the first lateral support rib 64a protrude equal distances from the side face 62. A support 68 is formed in a region bounded by the first lateral support rib 64a and upper support rib 66, but has a smaller protruding distance. An insertion slit 70 is formed in the terminal support 42 below the first lateral support rib 64a. The insertion slit 70 extends in the front-rear direction (left-right direction in FIG. 6) of the terminal support 42 and opens to the rear of the terminal support 42. The first lateral support rib 64a is more forward than the insertion slit 70, as shown in FIG. 6.

The base 44 is molded unitarily of synthetic resin and has a substantially rectangular plate-like shape with a longitudinal dimension substantially equal to the longitudinal dimension of the terminal support 42. Terminal insertion holes 72 penetrate the base 44 in the vertical direction. Furthermore, support pins 74 protrude up near a front (right in FIG. 6) edge of the base 44 at predetermined intervals in the longitudinal direction of the base 44 and at positions corresponding to the pin insertion holes 54 of the terminal support 42.

The fuse case 46 is molded unitarily of synthetic resin and has an elongated shape. Fuse accommodating portions 76 are formed in two vertically spaced tiers in the fuse case 46 and are arranged side by side in the longitudinal direction of the fuse case 46 in each tier. Each fuse accommodating portion 76 is a substantially rectangular recess that opens to the front side (right in FIG. 6) of the fuse case 46, and terminal insertion holes (not shown) are formed in upper and lower ends thereof penetrating the fuse accommodating portion 76.

Figure 7:
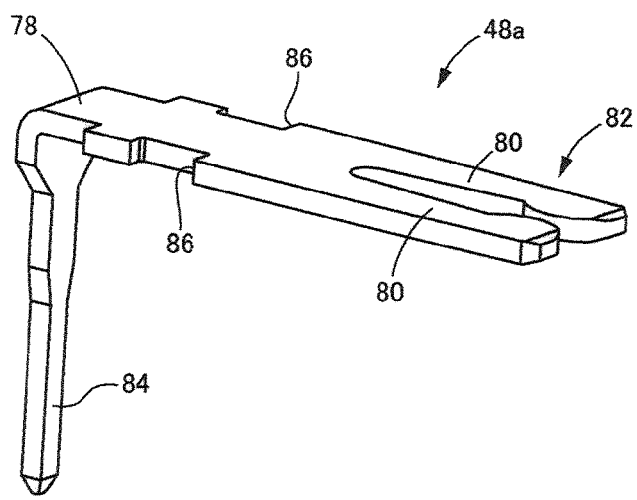
FIG. 7 is a perspective view of a board terminal constituting the fuse module.

All of the board terminals 48a to 48c have substantially the same shape. As shown in FIG. 7 the board terminal 48a, as an example, is formed by punching a metal plate to define an L-shape with a right angle bend 78. Opposed pressure-contact blades 80 are formed at one end of each board terminal 48a to 48c to define a tuning fork-like connecting portion 82 that sandwiches a connecting terminal of a fuse (not shown). A soldering portion 84 is at the other end and is inserted into and soldered to a through hole of the printed circuit board 16. Locking notches 86 are formed in opposite widthwise edges between the connecting portion 82 and the bend 78. The distance from the bend 78 to the soldering portion 84 differs among the board terminals 48a, 48b, and 48c, and gradually increases from the board terminals 48a to the board terminals 48b, and to the board terminals 48c.

The busbars 50a to 50e are formed by punching a metal plate to define connecting portions 82 and locking notches 86 similar to those of the board terminals 48a to 48c extend along one edge. The busbars 50a to 50e are arranged side by side.

The bus bar 50a has a flat plate-like portion 87 serving as an internal circuit. A plurality of side by side tuning fork-like connecting portions 82 are formed unitarily at one end edge of the flat plate-like portion 87. A first input terminal 90 defines a connecting terminal and is formed unitarily at an end edge 88 that is perpendicular to the end edge with the side by side connecting portions 82, and the first input terminal 90 is connected to the flat plate-like portions 87. The first input terminal 90 is formed into an L shape by bending a protruding piece in the end edge portion 88 of the flat plate-like portion 87 up into a crank shape, and has an upward extending portion 92 extending upright from the end edge 88 and a connecting portion 93 extending from an upper end of the upward extending portion 92 perpendicular to the direction in which the upward extending portion 92 extends and protruding to the outside of the flat plate-like portion 87. Thus, the connecting portion 93 is located above the connecting portions 82 that are formed in the bus bar 50a. Moreover, the first input terminal 90 has a substantially constant width in the upward extending portion 92 and the connecting portion 93, and the connecting portion 93 is a substantially flat tab with a predetermined width.

The busbars 50b to 50e each have a crank shape and soldering portions 84 similar to those of the board terminals 48a to 48c are formed in an end edge opposite the edge with the connecting portions 82. A second input terminal 96 is formed unitarily at an end edge 94 of the busbar 50b and on a part of the crank shape remote from the connecting portions 82 and on the same side as the first input terminal 90 of the busbar 50a. The second input terminal 96 has a substantially flat tab that protrudes in the same direction as the first input terminal 90.

The fuse module 40 is assembled by inserting the connecting portions 82 of the board terminals 48a to 48c into the respective terminal insertion holes 52a to 52c of the terminal support 42 from the rear (left side in FIG. 6) to protrude forward from the terminal support 42. The connecting portions 82 of the busbar 50a are arranged side by side in the same row as the connecting portions 82 of the board terminals 48b and are inserted into some of the terminal insertion holes 52b in the same manner as the board terminals 48b to protrude forward from the terminal support 42. Furthermore, as shown in FIG. 6, the busbar 50a is inserted into the insertion slit 70 from the rear of the terminal support 42. Therefore, the bus bar 50a is inserted into the insertion slit 70 in the width direction of the connecting portion 93 of the first input terminal 90. In addition, the first lateral support rib 64a is disposed forward of the bus bar 50a in the insertion direction thereof. Thus, the upward extending portion 92 of the first input terminal 90 is disposed on the side face 62 with an upper part of the upward extending portion 92 disposed on the support 68 and fit between the lateral support rib 64a and the upper support rib 66. The free end of the first input terminal 90 protrudes out from the terminal support 42 in the longitudinal direction.

The terminal support 42 to which the board terminals 48a to 48c and the busbars 50a have been mounted then is laid on the base 44, and the support pins 74 of the base 44 advance through the corresponding pin insertion holes 54 of the terminal support 42. Thus, the support pins 74 are inserted between the locking notches 86 of adjacent board terminals 48a, adjacent board terminals 48b (or the busbar 50a), and adjacent board terminals 48c. The engagement of the support pins 74 with the locking notches 86 of the board terminals 48a to 48c and the busbar 50a prevent the board terminals 48a to 48c and the busbar 50a from being detached inadvertently from the terminal support 42 and support the connecting portions 82 of the board terminals 48a to 48c and the busbar 50a during insertion/removal of fuses. Moreover, the soldering portions 84 of the board terminals 48a to 48c are inserted into the respective terminal insertion holes 72 of the base 44 and protrude down from the base 44.

The busbars 50b to 50e then are laid on the upper face 58 of the terminal support 42 and an upper face of the base 44. Thus, the support projections 60 formed on the upper face 58 of the terminal support 42 are inserted between adjacent locking notches 86 of the busbars 50b to 50e. As a result, the engagement of the locking notches 86 of the busbars 50b to 50e with the support projections 60 support the connecting portions 82 of the busbars 50b to 50e during insertion/removal of a fuse. Moreover, the soldering portions 84 of the busbars 50b to 50e protrude down through the terminal insertion holes 72 of the base 44. Furthermore, the second input terminal 96 protrudes laterally from the base 44. As is clear from FIG. 6, the second input terminal 96 is disposed below (below in FIG. 6) the first input terminal 90 and rearward of the first input terminal 90 in the front-rear direction of the fuse module 40 (the right side in FIG. 6 corresponds to the front, and the left side to the rear).

Figure 4:
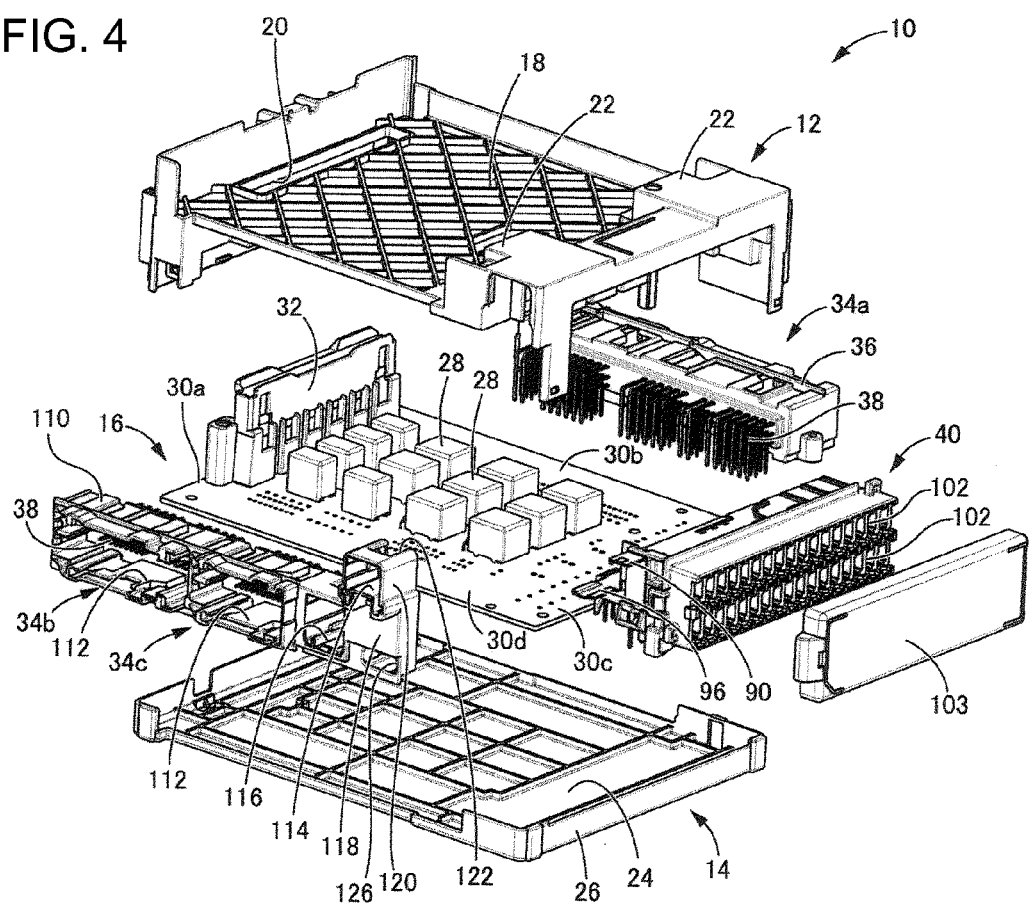
FIG. 4 is an exploded perspective view of the electrical junction box shown in FIG. 1.

The fuse case 46 is laid on a front face of the terminal support 42, and engagement frames 98 at opposite longitudinal ends of the fuse case 46 are engaged with engagement claws 100 at opposite longitudinal ends of the terminal support 42. The connecting portions 82 on the board terminals 48a and 48b and on the busbar 50a protrude forward from the terminal support 42 and are inserted into terminal insertion holes (not shown) of the fuse accommodating portions 76 in the lower tier. As a result, the connecting portions 82 of the board terminals 48a are opposed respectively to a corresponding connecting portion 82 of the board terminals 48b or the busbar 50a within each of the fuse accommodating portions 76. Similarly, the connecting portions 82 of the board terminals 48c and the connecting portions 82 of the busbars 50b to 50e are inserted into the fuse accommodating portions 76 in the upper tier and are located in opposing positions. A fuse attachment portion 102 is formed from a fuse accommodating portion 76 and two connecting portions 82 disposed therein. The fuse attachment portions 102 are arranged in two vertically spaced tiers, and the fuse attachment portions 102 in each tier are arranged side by side in the longitudinal direction of the fuse module 40. As shown in FIG. 4, a cover 103 can be mounted to the fuse module 40 to cover the openings of the fuse attachment portions 102 and protecting the connecting portions 82 therein.

As shown in FIG. 4, the above-described fuse module 40 is placed on the outer peripheral portion 30c of the printed circuit board 16, and the soldering portions 84 of the board terminals 48a to 48c and the bus bars 50b to 50e are inserted into and soldered to the respective through holes of the printed circuit board 16. Bolt fixing portions 106 formed at opposite longitudinal ends of the terminal holding block 42 then are fixed to the printed circuit board 16 with respective bolts 108 (see FIG. 9) to fix the fuse module 40 to the outer peripheral portion 30c of the printed circuit board 16.

A side wall 110 is disposed at one outer peripheral portion 30d of the printed circuit board 16 that extends perpendicular to the longitudinal direction of the fuse module 40. The side wall 110 is molded unitarily of synthetic resin and has an elongated shape. Two longitudinally adjacent connector accommodating portions 112 are formed in the side wall 110 and define rectangular recesses that open to an outer side of the printed circuit board 16. L-shaped connecting terminals 38 are inserted into the connector accommodating portions 112 to define lateral connection type connectors 34b and 34c similar to the lateral connection type connector 34a described above.

Figure 8:
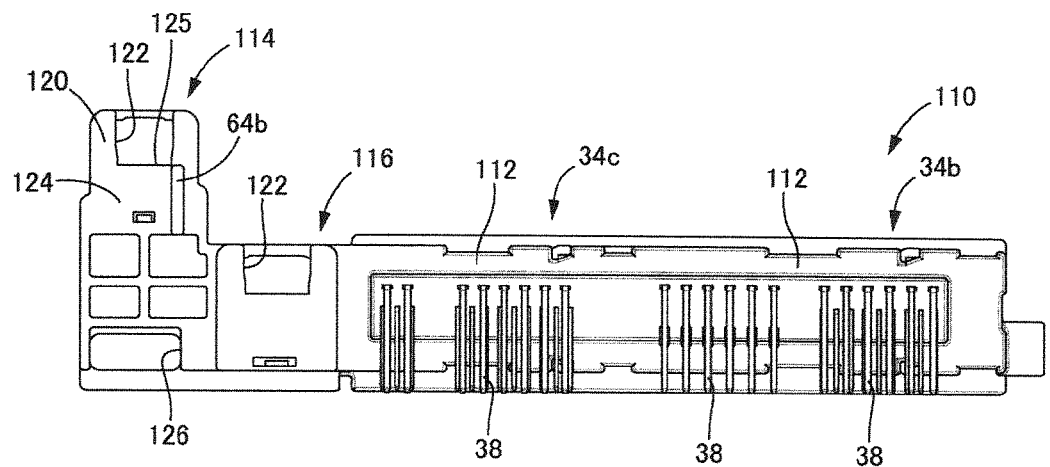
FIG. 8 is a back view of a side wall member.

First and second connector accommodating portions 114 and 116 are formed at a longitudinal end of the side wall 110 near the fuse module 40. The first and second connector accommodating portions 114 and 116 define empty spaces that open to the outer side of the printed circuit board 16. The first connector accommodating portion 114 is formed inside a substantially rectangular hood 120 that extends from a side face 118 of the side wall 110 to the outer side of the printed circuit board 16. On the other hand, the second connector accommodating portion 116 is a recess that opens into the side face 118 of the side wall 110. Thus, an opening end of the first connector accommodating portion 114 protrudes and is located farther out from the printed circuit board 16 than an opening end of the second connector accommodating portion 116. As shown in FIG. 8, the first and second connector accommodating portions 114 and 116 pass through the side wall 110 from the inner side of the printed circuit board 16 toward the outer side through respective terminal insertion openings 122 that penetrate through the side wall 110. The terminal insertion openings 122 extend continuously even to the upper side of the first and second connector accommodating portions 114 and 116, respectively, and the first and second connector accommodating portions 114 and 116 also open up through the respective terminal insertion openings 122.

The first and second connector accommodating portions 114 and 116 are shifted from each other in the vertical direction, with the first connector accommodating portion 114 being higher than the second connector accommodating portion 116. Furthermore, the first and second connector accommodating portions 114 and 116 are shifted from each other in the left-right direction in FIG. 8, which corresponds to the longitudinal direction of the side wall 110 so that the second connector accommodating portion 116 is farther on the inner side of the side wall 110 than the first connector accommodating portion 114 in the longitudinal direction of the side wall 110. Thus, the first and second connector accommodating portions 114 and 116 do not overlap and are spaced apart from each other in both of the vertical direction and the left-right direction.

A second lateral support rib 64b protrudes unitarily from a back face 124 of the side wall 110, which is on the side of the printed circuit board 16. The second lateral support rib 64b extends down from a lower edge of the terminal insertion opening 122 of the first connector accommodating portion 114 and is disposed on the inner side of the side wall 110 with respect to this terminal insertion opening 122 in the longitudinal direction of the side wall 110.

An opening window 126 penetrates the side wall 110 under the first connector accommodating portion 114. The opening window 126 is a through hole that has a substantially elongated rectangular shape extending in the longitudinal direction of the side wall 110, and is formed in a lower end portion of the side wall 110. An opening end face of the opening window 126 is recessed slightly farther back toward the printed circuit board 16 than the side face 118 that constitutes an opening end of the second connector accommodating portion 116.

Figure 2:
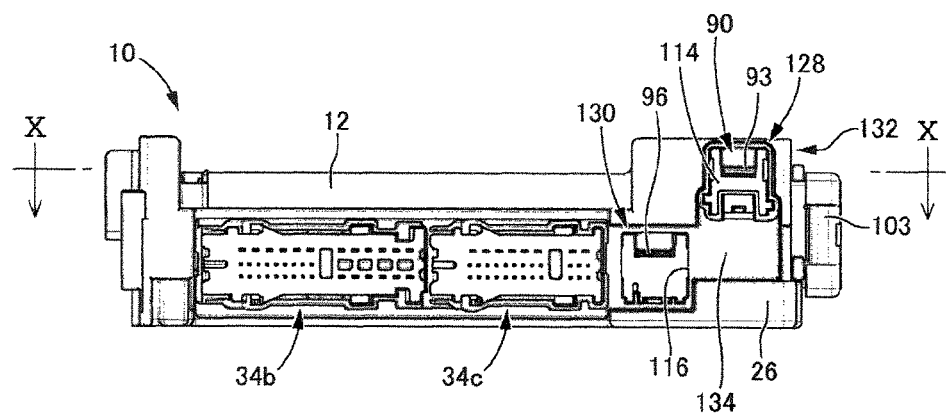
FIG. 2 is a side view of the electrical junction box shown in FIG. 1.

The side wall 110 is laid on the outer peripheral portion 30d of the printed circuit board 16, and the board terminals 38 of the lateral connection type connectors 34b and 34c in the side wall 110 are inserted into and soldered to through holes of the printed circuit board 16. Thus, the side wall 110 is disposed along the outer peripheral portion 30d of the printed circuit board 16. The side wall 110 is mounted to the printed circuit board 16 before the fuse module 40. The fuse module 40 then is laid on the outer peripheral portion 30c of the printed circuit board 16 from above the side wall 110, so that the connecting portion 93 of the first and second input terminals 90 and 96 that protrude from the fuse module 40, are inserted from above into the respective terminal insertion openings 122 of the first and second connector accommodating portions 114 and 116 and are disposed respectively within the first and second connector accommodating portions 114 and 116. Thus, as shown in FIG. 2, a first connector attachment portion 128 is formed by the first input terminal 90 and the first connector accommodating portion 114, and a second connector attachment portion 130 is formed by the second input terminal 96 and the second connector accommodating portion 116.

Figure 9:
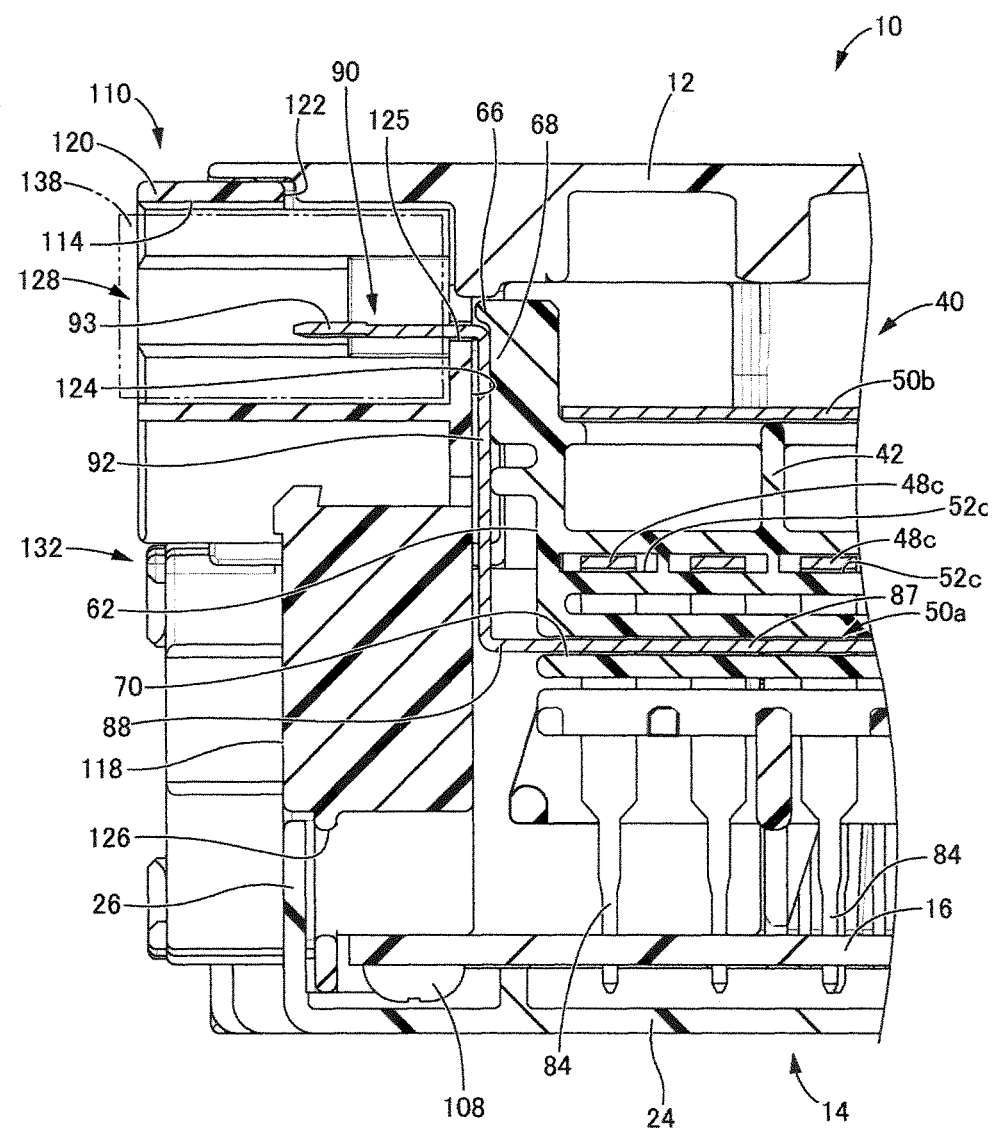
FIG. 9 is an enlarged view of a relevant portion of cross section IX-IX in FIG. 1.
Figure 10:
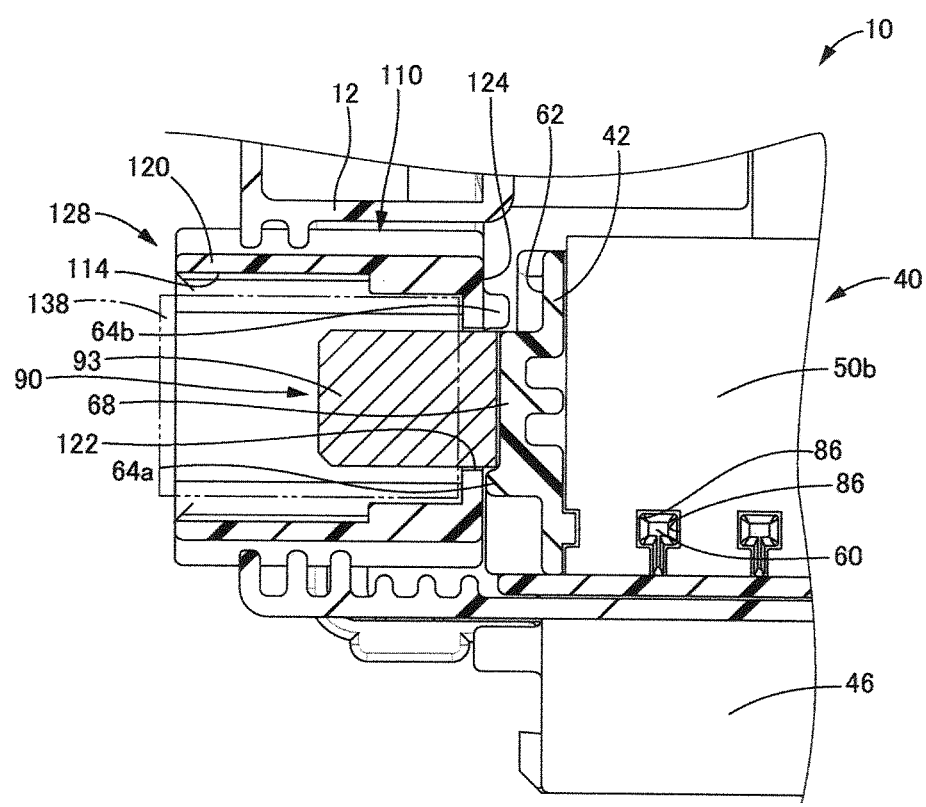
FIG. 10 is an enlarged view of a relevant portion of cross-section X-X in FIG. 2.

The side face 62 of the terminal support 42 and the back face 124 of the first connector accommodating portion 114 of the side wall 110 face each other when the side wall 110 and the fuse module 40 are mounted to the printed circuit board 16, as shown in FIG. 9, and the upward extending portion 92 of the first input terminal 90 is sandwiched therebetween. Thus, the side face 62 of the terminal support 42 faces the first connector accommodating portion 114, which functions as the housing, and the back face 124 of the first connector accommodating portion 114 faces the terminal support 42. The upward extending portion 92 of the first input terminal 90 is sandwiched by the back face 124 of the first connector accommodating portion 114 and the support protruding portion 68 of the terminal support 42 from both sides in the direction in which the connecting portion 93 protrudes. Moreover, the connecting portion 93 is sandwiched by the upper support rib 66 and the opening edge 125 at the lower end of the terminal insertion opening 122 of the first connector accommodating portion 114 from both sides in the vertical direction. Furthermore, as shown in FIG. 10, the first lateral support rib 64a, which is formed on the terminal support 42, is disposed on one side of the connecting portion 93 of the first input terminal 90 in the width direction (vertical direction in FIG. 10), and the second lateral support rib 64b, which is formed on the side wall 110, is formed on the other side. Thus, the connecting portion 93 is sandwiched by the first and second lateral support ribs 64a and 64b from both sides thereof in the width direction.

As shown in FIG. 9, the opening window 126 of the side wall 110 is close to the surface (upper face in FIG. 9) of the printed circuit board 16, and is on extensions of the respective lines on which the soldering portions 84 of the board terminals 48a to 48c and the busbars 50b to 50e in the fuse module 40, are arranged side by side in the arrangement direction (left-right direction in FIG. 9). It should be noted that the opening window 126 is configured to be covered by the peripheral wall 26 of the lower case 14 from the outer side.

Figure 3:
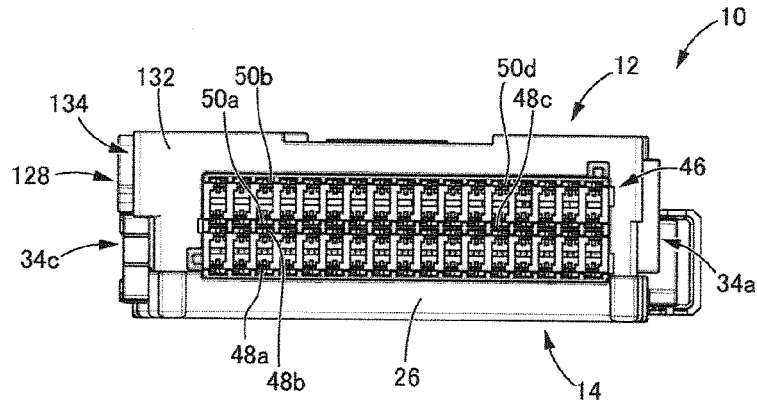
FIG. 3 is a side view of the electrical junction box shown in FIG. 1 as seen from a direction different from that of FIG. 2.

The printed circuit board 16 is accommodated between the upper and lower cases 12 and 14. In addition, as shown in FIG. 3, the fuse attachment portions 102 of the fuse module 40 open into a first side face 132 of the electrical junction box 10, and are arranged side by side in the direction in which the first side face 132 extends (left-right direction in FIG. 3) and in two tiers that are vertically one above the other. Moreover, as shown in FIG. 2, the first and second connector attachment portions 128 and 130 of the side wall 110 open into a second side face 134 of the electrical junction box 10 that is perpendicular to the first side face 132. Furthermore, as shown in FIG. 1, the connector 32 for external connection protrudes above the attachment surface 18 through the connector insertion hole 20 in the attachment surface 18.

The electrical junction box 10 is disposed, for example, in a compartment of an automobile. Then, a shaft in an external circuit member, such as an ECU (not shown) is supported by the bearings 22 of the upper case 12, and the external circuit member is rotated on the shaft and superposed on the attachment surface 18. Thus, a connector in the external circuit member is connected to the connector 32 for external connection that protrudes above the attachment surface 18 so that the printed circuit board 16 and the external circuit member are connected to each other. Moreover, connectors (not shown) are connected to the lateral connection type connectors 34a to 34c that open to the lateral sides of the electrical junction box 10.

Figure 11A:
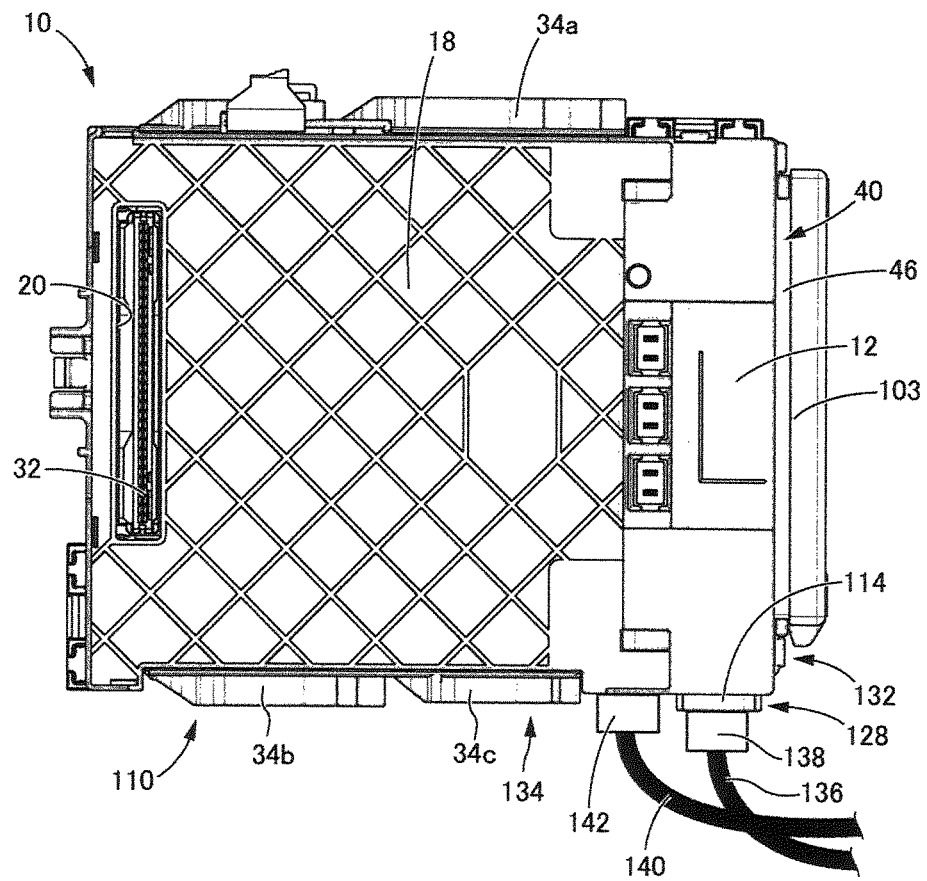
FIG. 11A is a plan view showing a state in which connectors are connected to the electrical junction box.
Figure 11B:
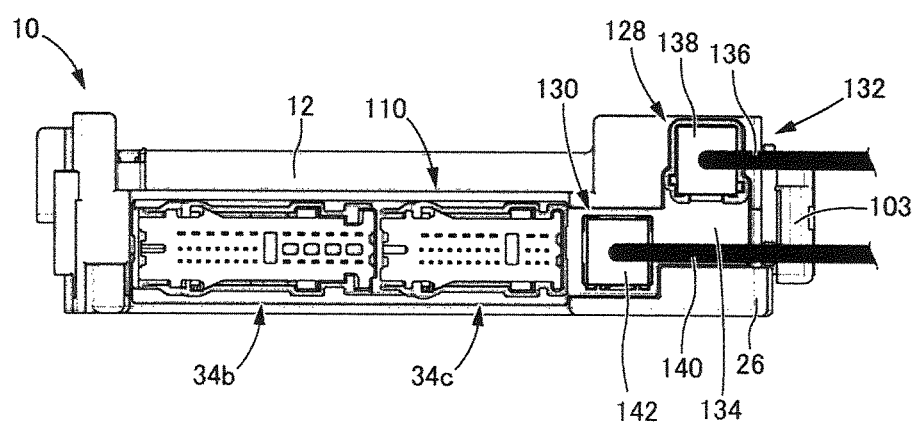
FIG. 11B is a side view showing the same state as in FIG. 11A.

Fuses (not shown) are connected respectively to the fuse attachment portions 102 that open into the first side face 132 of the electrical junction box 10. The fuses receive power supplied thereto via connectors connected respectively to the first and second lateral connection type connectors 128 and 130 that open into the second side face 134. More particularly, a connector 138 at an end of a wire 136 from a battery is connected to the first lateral connection type connector 128 and a connector 142 at an end of a wire 140 from an alternator is connected to the second connector attachment portion 130, as shown in FIGS. 11A and 11B. The connector 138 is connected to the first input terminal 90 in the first lateral connection type connector 128, and the connector 142 is connected to the second input terminal 96 in the second lateral connection type connector 130, so that power is supplied to the fuse attachment portions 102 via the first and second input terminals 90 and 96.

The wires 136 and 140 extending from the respective lateral connection type connectors 128 and 130 may have to be bent due to a layout space or the like in a vehicle. However, the first and second lateral connection type connectors 128 and 130 are shifted vertically from each other so that overlapping of the two wires 136 and 140 and resulting interference between the wires 136 and 140 can be reduced. As a result, the bend radius of the wires 136 and 140 can be reduced even more, and the layout space of the electrical junction box 10 with the wires 136 and 140 taken into account can be reduced even more.

Figure 12A:
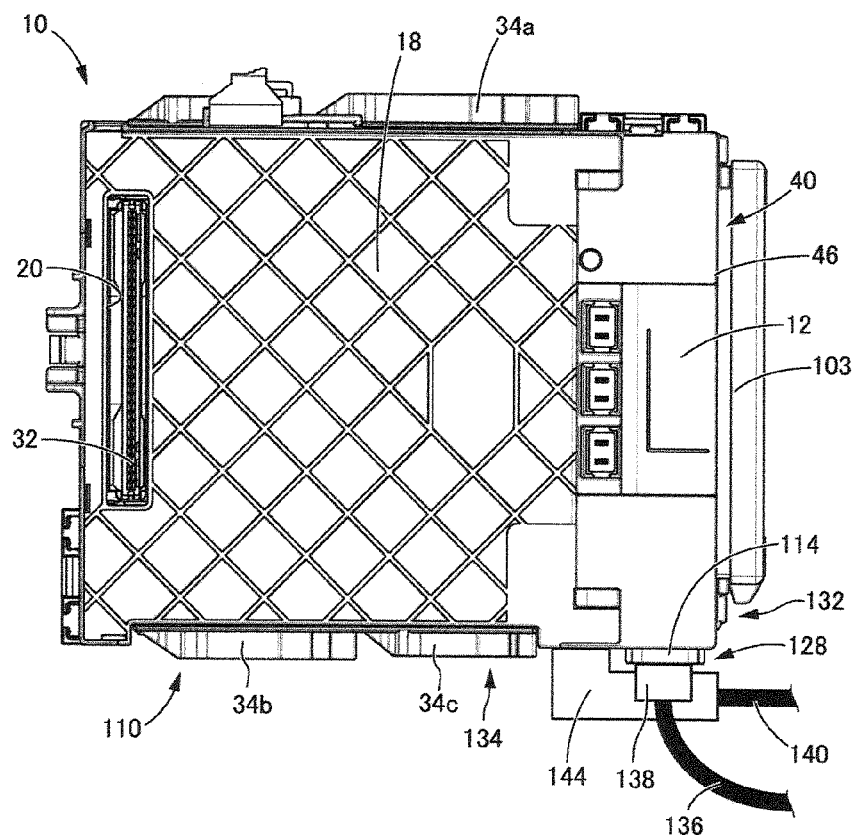
FIG. 12A is a plan view showing a state in which a different connector from the connector in FIGS. 11A and 11B is connected to the electrical junction box.
Figure 12B:
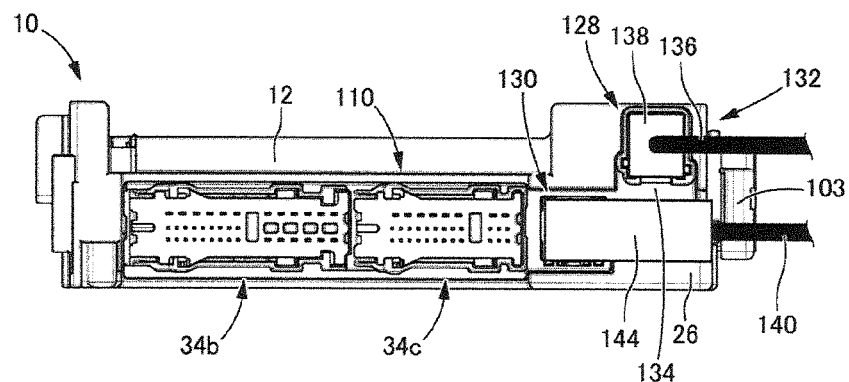
FIG. 12B is a side view showing the same state as in FIG. 12A.

The first and second lateral connection type connectors 128 and 130 also are shifted from each other laterally so that the second lateral connection type connector 130 is more inward on the electrical junction box 10 in the direction in which the second side face 134 extends. Thus, a vacant space under the first lateral connection type connector 128 can be used efficiently by connecting an L-shaped connector 144 to the second lateral connection type connector 130, as shown in FIGS. 12A and 12B. The L-shaped connector 144 achieves high space efficiency so that the protruding length from the electrical junction box 10 is small. As a result, the wire 140 can be extended in a direction perpendicular to an opening direction (down in FIG. 12A) of the second lateral connection type connector 130 without bending the wire 140, thereby achieving better space efficiency.

The first and second lateral connection type connectors 128 and 130 are shifted vertically shifted from each other by making use of the dimension of the fuse module 40 in the vertical direction. Specifically, the fuse attachment portions 102 are arranged in plural tiers. Accordingly, the first and second lateral connection type connectors 128 and 130 can be shifted vertically to achieve high space efficiency without increasing the vertical thickness (vertical direction in FIG. 12B) of the electrical junction box 10 beyond the vertical dimension of the fuse module 40.

Furthermore, the support protruding portion 68, which is provided on the side face 62 of the terminal support 42, is disposed rearward of the upward extending portion 92 of the first input terminal 90, which is disposed within the first lateral connection type connector 128, in the protruding direction (from the right side to the left side in FIG. 9) of the connecting portion 93. Thus, the upward extending portion 92 can be supported by the support protruding portion 68 against a pushing force that is exerted during insertion of the connector 138. Accordingly, even if the upward extending portion 92 is formed in the first input terminal 90, extending upright from the flat plate-like portion 87 of the bus bar 50a, in order to dispose the first lateral connection type connector 128 in an upper position, backward movement of the connecting portion 93 can be suppressed, and the connector can be connected stably. In addition, the back face 124 of the first connector accommodating portion 114 is disposed forward of the upward extending portion 92 in the protruding direction of the connecting portion 93. Thus, the upward extending portion 92 is supported by the back face 124 when the connector 138 is removed from the connecting portion 93. Consequently, the first input terminal 90 is supported during both insertion and removal of the connector 138 into and from the connecting portion 93, and the insertion and removal can be performed stably.

Additionally, as shown in FIG. 10, the connecting portion 93 of the first input terminal 90 is sandwiched by the first lateral support rib 64a, which is provided on the terminal support 42, and the second lateral support rib 64b, which is provided on the back face 124 of the first connector accommodating portion 114, from both sides in the width direction (vertical direction in FIG. 10) thereof. Thus, the connecting portion 93 is positioned accurately within the first connector accommodating portion 114 by positioning the connecting portion 93 from both sides in the width direction thereof, and displacement of the connecting portion 93 during removal of the connector 138 can be reduced. In particular, the lateral support ribs are provided separately provided with the first lateral support rib 64a on the terminal support 42 and the second lateral support rib 64b on the first connector accommodating portion 114, which faces the terminal supporting member 42, even in the case where the connecting portion 93 is mounted in the width direction (from the upper side to the lower side in FIG. 10) by inserting the bus bar 50a into the insertion slit 70 of the terminal supporting member 42, the second lateral support rib 64b is rearward of the connecting portion 93 in the insertion direction (from the upper side to the lower side in FIG. 10). As a result, the connecting portion 93 is sandwiched by the first and second lateral support ribs 64a and 64b from both sides in the width direction. Consequently, the direction in which the bus bar 50a is mounted to the terminal supporting member 42 can be designed with a higher degree of flexibility.

The connecting portion 93 also is sandwiched vertically by the upper support rib 66 of the terminal support 42 and the opening edge 125 of the terminal insertion opening 122 of the first connector accommodating portion 114, as shown in FIG. 9. Thus, the connecting portion 93 can be positioned more accurately within the first connector accommodating portion 114, and displacement of the connecting portion 93 is prevented more effectively, so that better connection stability can be obtained.

The opening window 126 is formed under the first lateral connection type connector 128 in the side wall 110. Thus, the soldering portions 84 of the respective board terminals 48a to 48c provided in the fuse module 40 can be visually observed through the opening window 126, so that the soldered state of the board terminals 48a to 48c can be checked easily. In addition, the opening window 126 is formed in a vacant space under the first lateral connection type connector 128 that is located closest to the fuse attachment portions 102 in the direction in which the second side face 134 extends. Thus, the opening window 126 is in a position on the extension lines of the respective lines on which the soldering portions 84 of the board terminals 48a to 48c are arranged side by side in the arrangement direction to enable visual observation and with high space efficiency.

Although an embodiment of the invention has been described in detail above, the invention is not limited to the specific descriptions thereof. For example, in the above-described embodiment, the connecting terminals that are supported by the terminal support and the housing are formed unitarily with the busbar, and the busbar defines the internal circuit in which the connecting terminals are provided. However, the internal circuit may also be a printed circuit board, and the connecting terminals may also be metal terminals provided on the printed circuit board by soldering, pressure-fitting, or the like.

Various members can be employed for the terminal support in accordance with the position of a connecting terminal to be supported, and the terminal support is not limited to a constituent member of the fuse module as described in the above embodiment. For example, the terminal support may be prepared independently. Alternatively, it is possible to form a supporting region for the connecting terminals in the upper case and use the upper case as the terminal support. Therefore, the invention does not require the fuse module.

Plural lateral connection type connectors may be provided like the first and second lateral connection type connectors 128 and 130 of the above embodiment, but without shifting all of the lateral connection type connectors in both the direction in which the tiers of the fuse attachment portions are placed one above another and the direction in which the second side face extends. The lateral connection type connectors also may partially overlap in the direction in which the tiers of the fuse attachment portions are placed one above another or the direction in which the second side face extends. Furthermore, the lateral connection type connectors may be disposed in the same position in the direction in which the second side face extends and in shifted positions in only the direction in which the tiers of the fuse attachment portions are placed one above another.

The invention is not limited to an electrical junction box to which a separate circuit member such as an ECU unit is connected as in the above-described embodiment, and the invention can apply to an electrical junction box in which an attachment portion for an electrical component such as a relay or a connector is provided on the upper face.

What is claimed is:

1. An electrical junction box comprising:
    at least one lateral connection type connector having a housing that opens at a side face of a box body, and a connecting terminal connected to an internal circuit accommodated in the box body, the connecting terminal having an L-shape that includes an extending portion extending upright from the internal circuit and having opposite first and second side edges, the connecting terminal further having a connecting portion extending from a leading end of the extending portion and being perpendicular to the extending portion, the connecting portion being accommodated in the housing;
    a terminal support disposed on a side of the extending portion that is opposite to the housing;
    a first lateral support rib-protruding from a face of the terminal support that faces the housing and being substantially adjacent the first side edge of the extending portion; and
    a second lateral support rib protruding from a face of the housing that faces the terminal support and being substantially adjacent the second side edge of the extending portion so that the connecting terminal is sandwiched by the first and second lateral support rib from both sides in a width direction thereof.

2. The electrical junction box of claim 1, wherein the internal circuit is part of a busbar, the extending portion and the connecting portion of the connecting terminal being unitary with the busbar.

3. The electrical junction box of claim 2, further comprising an insertion slit in the terminal support, and a part of the busbar substantially adjacent the extending portion being inserted into the insertion slit.

4. The electrical junction box of claim 3, wherein the extending portion is disposed on a face of the terminal support that faces the housing.

5. The electrical junction box of claim 3, the slit has an open end and a closed end, the first lateral support rib being in proximity to the closed end of the slit.

6. The electrical junction box of claim 5, wherein the first lateral support rib (64a) is substantially perpendicular to the slit.

7. The electrical junction box of claim 5, wherein the second lateral support rib (64b) being in proximity to the open end of the slit.

8. The electrical junction box of claim 3, the second lateral support rib is substantially perpendicular to the slit.

9. The electrical junction box of claim 1, wherein the first and second lateral support ribs are substantially parallel.

10. The electrical junction box of claim 1, further comprising an upper support rib protruding from the face of the terminal support that faces the housing.

11. The electrical junction box of claim 10, further comprising a terminal insertion opening formed in the face of the housing that faces the terminal support, and the connecting portion of the connecting terminal being inserted through the terminal insertion opening and into the housing.

12. The electrical junction box of claim 11, wherein the connecting portion is sandwiched by an edge of the terminal insertion opening and the upper support rib.

* * * * *